Aug. 12, 1969 J. D. STANDEVEN ET AL 3,461,314

HIGH SPEED ANTISATURATING TRANSISTORIZED INVERTER

Filed Oct. 13, 1965

INVENTORS
JOSEPH D. STANDEVEN
THOMAS A. STAUFFER

BY D R Pressman

ATTORNEY

United States Patent Office 3,461,314

Patented Aug. 12, 1969

3,461,314
HIGH SPEED ANTISATURATING TRANSISTORIZED INVERTER

Joseph David Standeven, Roslyn, and Thomas A. Stauffer, Hatboro, Pa., assignors to Philco-Ford Corporation, Philadelphia, Pa., a corporation of Delaware Filed Oct. 13, 1965, Ser. No. 495,575
Int. Cl. H03k 5/20
U.S. Cl. 307—235 6 Claims

ABSTRACT OF THE DISCLOSURE

High speed antisaturating transistorized inverter comprising an emitter follower driver stage and a cascaded common emitter output stage, plus an input voltage limiting circuit comprising a diode and the collector-emitter circuit of an additional transistor connected in series between the input of the driver stage and the output of the output stage. The limiting circuit becomes conductive to provide a bypass from the input of the driver stage to the output of the output stage when an input signal becomes large enough to drive the output transistor to saturation. The time required to turn on the additional transistor allows the input signal to provide an initial overdrive to the output stage, causing the output pulse to have a sharp leading edge. The added impedance provided in series with the diode by the collector-emitter circuit of the additional transistor enables the output transistor to be driven closer to saturation. Also, the base-emitter diode of the additional transistor, connected in series with the load resistor of the output stage, provides a constant voltage drop which permits the value of the load resistor, and hence the RC time constant of the output circuit, to be lowered.

Figure 1:
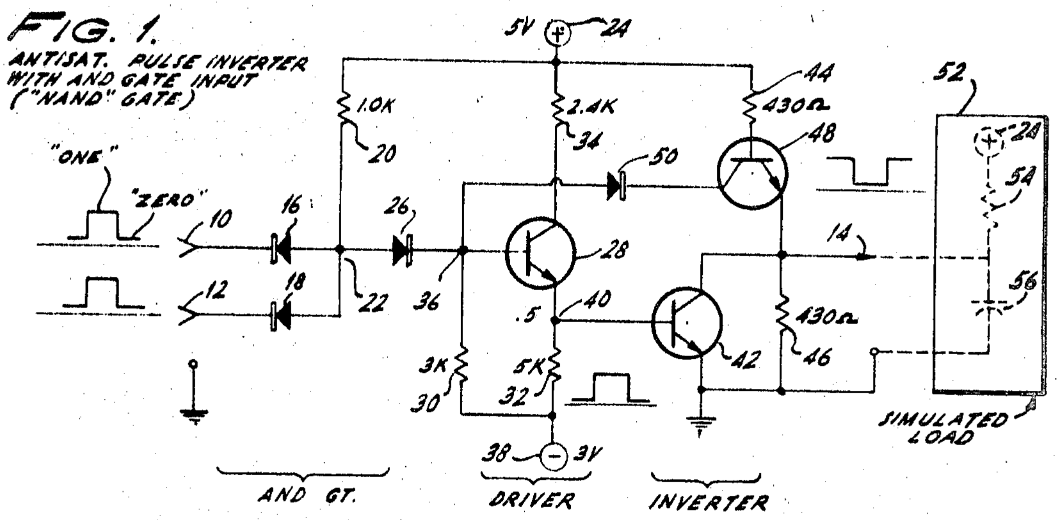

This invention relates to high-speed pulse circuitry, and more particularly to high-speed semiconductor pulse circuits of the anti-saturating type.

Extremely high translating speeds are highly desirable in pulse handling circuitry. For instance in digital computers, wherein many thousands of pulse handling circuits are usually cascaded, a slight increase in the speed of one pulse handling circuit will be multiplied many thousands of times for an overall computation operation. This increase in speed is desirable since the operating time of digital computers is extremely costly and therefore a reduction of computation time will be of great financial benefit.

One known method of increasing speed of pulse handling circuitry is to prevent the transistors used in such circuitry from bottoming or saturating when rendered conductive. As is well known, a transistor may be driven to a state of saturation by forward biasing its base-emitter junction so strongly that the collector potential will fall very close to the emitter potential. In this state, further increases in the base-emitter forward biasing potential will have an insignificant effect upon the collector potential. Charge carriers become stored in the base region of the transistor, resulting in an appreciable time lag for the collector potential to return to its former state after the base-emitter driving potential is removed. In Patent 2,887,542 to R. R. Blair et al., entitled "Non-saturating Junction-Transistor Circuits," granted May 19, 1959, several types of anti-saturating transistor pulse handling circuits are shown. These circuits generally comprise one or more driver transistors and an output transistor. The input of the driver transistor is connected to the output of the output transistor by means of a diode. Circuit parameters are adjusted so that the diode will become forward biased when the input signal to the driver transistor has a sufficient amplitude to cause the output transistor to saturate. When the diode becomes forward biased, current from the driving signal is conducted therethrough to the output, thereby limiting the input potential to prevent the same from causing the output transistor to become saturated. The antisaturation circuits shown in the Blair patent provide a great improvement over prior art transistor pulse handling circuits. However circuits of the Blair type still operate with a time lag which can be shortened greatly according to the present invention.

OBJECTS

Accordingly several objects of the present invention are: (1) to provide improved and novel pulse-handling transistor circuits; and (2) to provide anti-saturating transistor pulse-handling circuits having considerably higher operating speed than prior art anti-saturating circuits. Other objects of the present invention are: (3) to provide anti-saturating transistor pulse-handling circuits which can be fabricated in monolithic microcircuit form; and (4) to provide pulse-handling circuits which can be easily adaptable to the form of collector logic wherein several circuits utilize a common load resistor. Further objects and advantages of the present invention will become apparent from a consideration of the ensuing description thereof.

SUMMARY

According to the present invention, a plurality of transistors are cascaded in an amplifier configuration. An additional transistor is connected in the load circuit of the output transistor such that the load current flows through the base-emitter diode of this load transistor. The collector of this additional transistor is connected to the input of the first transistor in the series via a diode. When the input signal has a sufficient amplitude to drive the output transistor into saturation, the diode and the additional transistor will be rendered conductive, thereby limiting the potential of the input signal. The base-emitter diode of the additional transistor will also act as a constant voltage device, thereby permitting the use of a lower-valued load resistor to decrease the RC time constant of the output circuit of the output transistor. Further, the time required for the additional transistor to become conductive will provide a desirable temporary overdrive of the load to sharpen the leading edge of the output pulse. In addition, the collector-emitter path of the additional transistor will provide an additional voltage drop in the input signal limiting circuit, thereby increasing noise immunity by allowing the output transistor to be driven closer to saturation.

DRAWINGS

FIG. 1 of the drawings shows an anti-saturation pulse inverter circuit with a logic gate input.

Figure 2:
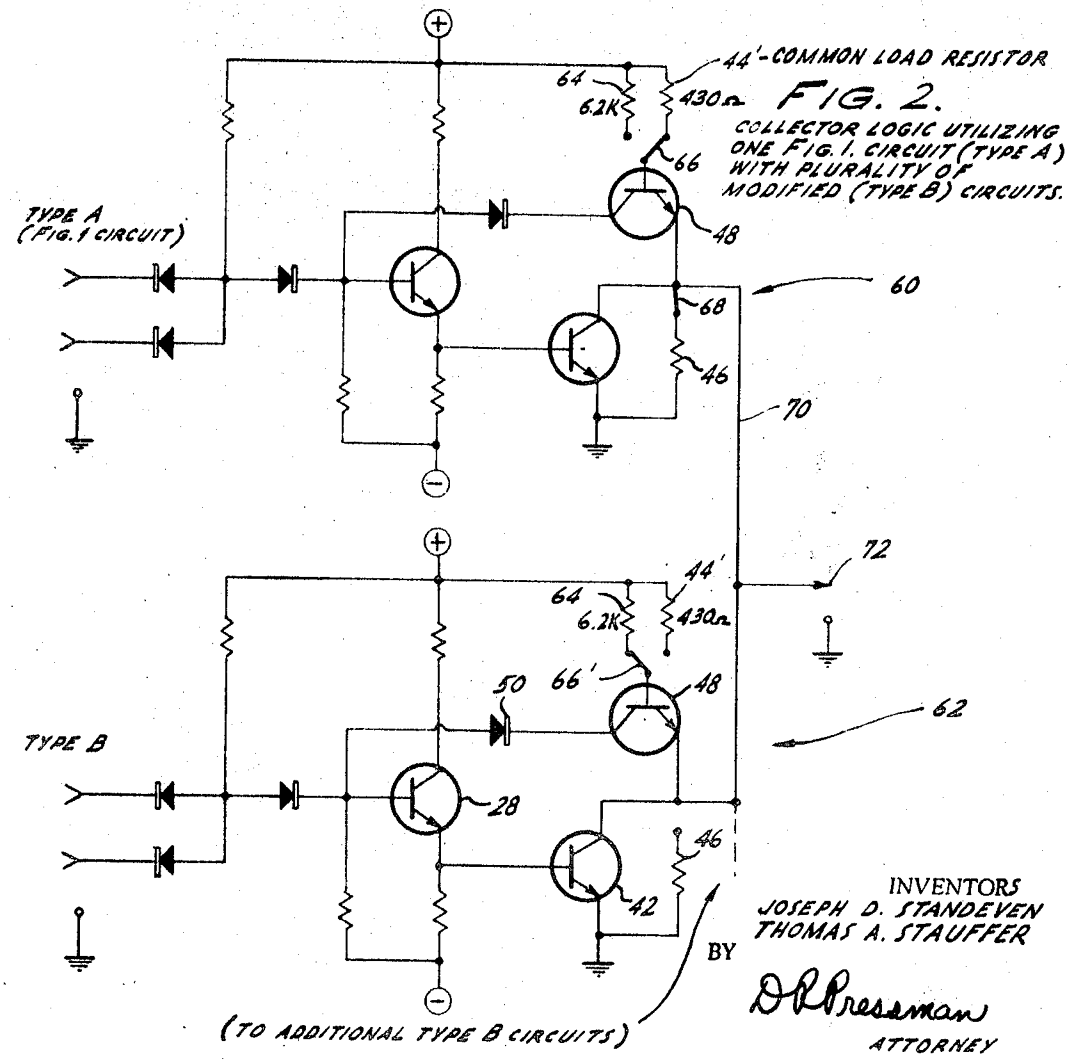

FIG. 2 of the drawings shows a circuit of the type shown in FIG. 1 and a second circuit which is a modification of the circuit shown in FIG. 1, both circuits being commonly connected to utilize the same load resistor.

FIG. 1.—Description

FIG. 1 shows an anti-saturation pulse inverter circuit with an AND gate connected at the input thereof. Thus the logical operation performed by the circuit of FIG. 1 is known as the "NAND" (NOT-AND) operation. When positive inputs are applied to both of input terminals 10 and 12, a ground will be provided at output terminal 14. In the following description a binary ONE will be represented by a positive voltage and a binary ZERO will be represented by a ground or a close-to-ground voltage. Thus the circuit of FIG. 1 will provide a ONE output unless both of the inputs 10 and 12 thereof receive ONES.

The circuit can conveniently be described section by section. The circuit comprises an AND gate, a driver, and an output stage. Additionally the circuit includes a voltage limiting circuit.

The AND gate includes diodes 16 and 18 and resistor 20. Input terminals 10 and 12 are connected to the cathodes of diode 16 and 18, respectively. The anodes of diodes 16 and 18 are commonly connected to a junction point 22, to which the lower end of resistor 20 is also connected. The upper end of resistor 20 is connected to a positive potential source 24.

The driver stage comprises a bias level shifting diode 26, a transistor 28, and bias resistors 30, 32, and 34. The base of transistor 28 is connected to the cathode of diode 26 to form a junction point 36. Resistor 30 is connected between junction 36 and a negative voltage source 38. Resistor 32, which is connected between the emitter of transistor 28 and negative source 38, is an emitter load resistor. Resistor 34 is connected between the collector of transistor 28 and the positive source 24. The driver stage is an emitter follower since the input thereto is supplied to the base of transistor 28 and the output will appear at the emitter of transistor 28 (terminal 40) in the same phase as the input.

The inverter-output stages comprises transistor 42 and load resistor 44. The base of transistor 42 is connected to junction 40 and the emitter thereof is connected to ground or reference potential. One terminal of resistor 44 is connected to bias source 24.

The voltage limiting circuit, which is closely related to the output circuit, comprises transistor 48, resistor 46, and diode 50. The collector of transistor 42 is connected to the emitter of transistor 48. The base of transistor 48 is connected to the other terminal of load resistor 44. The output terminal 14 is connected to the junction of the collector of transistor 24 and the emitter of transistor 48. Diode 50 is connected between terminal 36 and the collector of transistor 48. Resistor 46 is connected from the emitter of transistor 48 to ground. It will be apparent that the collector and emitter connections of transistor 48 can be interchanged without substantially affecting circuit operation.

In a computer, many circuits of the type shown in FIG. 1 will usually be cascaded, i.e., the circuit of FIG. 1 will be used to operate additional circuits identical to or very similar to itself. Thus in any description of the circuit of FIG. 1 the load impedance thereof must be considered. The impedance of the load presented by such a similar circuit will have both resistive and capacitive components as represented by simulated load 52 which includes resistor 54 and capacitor 56 which are connected to bias source 24 and to ground, respectively.

FIG. 1.—Operation

In its quiescent state, wherein no positive inputs are applied to input terminals 10 and 12, input terminals 10 and 12 will be at or close to ground potential. Hence current will be drawn from source 24, through resistor 20, and diodes 16 and 18 to respective input terminals 10 and 12. The potential at point 22 will be equal to the potential of input terminals 10 and 12 plus the forward drop across diodes 16 and 18.

Current will also be drawn from source 24, through resistor 20, diode 26, and resistor 30 to the negative source 38. A small voltage drop, due to the forward offset voltage of diode 26, will be produced across diode 26, causing the potential at point 36 to be slightly lower than that at point 22, i.e., about the potential of input terminals 10 and 12. Transistor 28 will conduct moderately since the base thereof will be more positive than the emitter, which is connected to negative potential source 38 via resistor 32. The emitter potential of transistor 28 (junction 40) will be slightly positive, though not sufficiently positive to forward bias the base-emitter diode of transistor 42 to conduction.

Since transistor 42 is not conducting, the potential at output terminal 14 will be governed by the current flowing from source 24, through resistor 44, the base-emitter diode of transistor 48, resistor 46 and load resistance 54. In the circuit of FIG. 1 the voltage at point 14 will be about half the potential of source 24 since resistors 44 and 46 have equal values. Since the potential at the base of transisor 48 is greater than the potential at point 36, diode 50 will be back-biased and the base-collector-diode of transistor 48 will be forward biased but will conduct only the slight reverse leakage current flowing through diode 50.

Next assume that binary ONES are applied to both inputs 10 and 12. This will cause diodes 16 and 18 to become reversed biased through conventional AND gate action. The current through resistor 20 will decrease substantially, raising the potential at point 22. This potential rise will be translated across diode 26, which acts as a battery or constant voltage impedance. Thus the potential of point 36 will rise, forcing transistor 28 into heavy conduction. Through emitter follower action, the voltage at point 40 will rise to a positive value sufficient to turn transistor 42 on.

Through conventional common emitter amplifier action, when transistor 42 is turned on, the collector potential thereof will fall toward ground as transistor 42 draws load current through resistor 44 and the base-emitter diode of transistor 48. Were it not for the limiting circuit including diode 50 and transistor 48, transistor 42 would undesirably be driven to saturation by the voltage rise at point 36 and the corresponding voltage rise at point 40. However when the potential of point 36 rises to a sufficient level to begin to drive transistor 42 to saturation, the potential at point 36 will become greater than the potential at the emitter of transistor 48. Thus diode 50 will become forward biased, the collector junction of transistor 48 will become reverse biased, and transistor 48 will become conductive according to conventional transistor action. Current will flow through diode 50 and the collector-emitter circuit of transistor 48 to the output, thereby preventing the potential at point 36 from rising to a level sufficient to saturate transistor 42. However since this switching action of transistor 48 is somewhat delayed, the voltage at point 36 will initially rise to a value sufficient to saturate transistor 42 temporarily, thereby causing the output pulse at point 14 to have a sharp leading edge despite load capacitance 56; i.e., this temporary overdrive will provide sufficient current to charge load capacitance 56, thereby preventing a loss in rise time of the leading edge of the output pulse.

The incorporation of transistor 48 in the collector circuit of transistor 42 provides several advantages which all serve to improve the speed of the circuit.

The base-emitter diode of transistor 48, which is always forward biased due to resistor 46 or the resistance 54 of load 52, will advantageously provide a voltage drop in the collector circuit of transistor 42. Since transistor 48 is a silicon device, the base-emitter drop thereof will be about 0.7 volt. This voltage drop will permit the use of a lower value resistance 44, thereby decreasing the RC time constant of the collector network of transistor 42. In absence of transistor 48, a larger resistor 44 would be required to maintain the output potential of point 14 sufficiently high when transistor 42 is non-conductive. The substitution of the base-emitter diode of transistor 48 and a lower-valued resistor 44 for the former high-valued resistor 44 will provide a collector impedance having a substantially lower RC time constant; thus the collector voltage will be able to change more rapidly, thereby increasing the switching speed of the circuit.

Also, when the circuit is active, the collector-emitter path of transistor 48 will provide an additional voltage drop between point 36 and output terminal 14. This will drive transistor 42 closer to saturation, allowing the potential at point 14 to fall slightly closer to ground when the circuit is pulsed, thereby increasing slightly the potential swing at the output. Hence a larger output voltage transistion and greater switching speed and more noise immunity will be provided. In absence of the voltage drop provided by the collector-emitter path of the transistor 48, it was found that when circuits of the type shown in FIG. 1 were cascaded, an additional diode in series with diode 26 was required in order to provide the proper offset voltage to maintain an acceptable level of noise immunity for reliability purposes. The use of this additional diode served to lower the translation speed of the circuit.

Further, as previously discussed, the delayed switching action of transistor 48 will allow the input pulse at point 36 to drive transistor 42 into saturation temporarily, thereby providing a slight overdrive to the load to increase the steepness of the output pulse.

It was found that the incorporation of transistor 48 and bias resistor 30 in conjunction with a lowered value of resistor 44 substantially increased the switching speed of the circuit of FIG. 1. In a typical prior art antisaturation switching circuit, wherein transistor 48 was omitted and a large-valued resistor 44 was utilized, it was found that the propagation delay from input terminals 10 and 12 to output terminal 14 was on the order of 15 to 20 nanoseconds. However the circuit of FIG. 1 exhibited a propagation delay of only 10 nanoseconds, thus providing a speed increase of one and one-half to two times that of the prior art circuit. As will be recognized by those skilled in the art, this increase is highly advantageous in computer circuits wherein thousands of circuits of the type shown in FIG. 1 will usually be cascaded.

An additional advantage of the invention is the fact that the circuit of FIG. 1 can be easily formed within a silicon monolith, according to current and conventional microcircuit practice. The circuit does not incorporate any capacitors, inductors, or high valued resistors, which are difficult to fabricate in microcircuit form.

FIG. 2.—Description

The system of FIG. 2 illustrates the use of the invention in the case wherein a plurality of circuits are connected in parallel to the same load resistor; this type of system will be referred to herein as collector logic. The system of FIG. 2 is ideally suited for use in monolithic microcircuits. The system comprises one circuit identical to the circuit of FIG. 1 and one or more circuits similar to that of FIG. 1 but with two modifications: A larger resistor is used in lieu of the output load resistor 44, and the resistor 46 connecting the emitter of the limiting transistor to ground is omitted.

The FIG. 1 circuit, shown at 60 in the upper half of FIG. 2, will be referred to as a type A circuit. The modified version of the FIG. 1 circuit, shown at 62 in the lower half of FIG. 2, will be referred to herein as a type B circuit. The load resistor of the type A circuit, designated 44', serves as a common load resistor for all circuits in the series; it has the same value as resistor 44 of FIG. 1. In lieu of load resistor 44' in the type B circuits, a large-valued resistor 64 is used. Resistor 64 need supply only enough current to saturate the limiting transistor 48 and hence has a much higher value than resistor 44'. Resistor 46 is omitted in the type B circuits since resistor 46 of the single type A circuit will serve to forward bias all of the limiting transistors 48 in both types of circuits.

One easy way of fabricating the system of FIG. 2 in the form of a plurality of monolithic microcircuits is to construct a universal microcircuit monolith which can be used as either a type A or type B circuit depending on the surface metallization mask. Each universal monolith should be formed with two resistors as shown at 64' and 44'. As is well known, most interconnections between components in monolithic microcircuits are formed by surface metallization of the microcircuit by evaporating aluminum through an appropriate evaporation mask designed to allow the aluminum vapor to be deposited on only those areas of the surface of the microcircuit wherein connections are to be formed. To fabricate the type A and type B circuits from identical silicon monoliths, two metallization masks would be required. The type A circuit mask would be designed so that a connection 66 will be formed between the base of transistor 48 and one end of resistor 44'. In the type B circuit mask a connection 66' will be formed between the base of transistor 48 and bottom of resistor 64 and the connection 68 between resistor 46 and the emitter of transistor 48 is omitted. In this way the type A and type B circuits can be formed without substantially increasing the production cost.

After completion of the individual microcircuits, the emitters of all the transistors 48 can be connected together by an external lead 70 to form a common output terminal 72.

FIG. 2.—Operation

The system of FIG. 2 may be regarded as a plurality of NAND gates supplying a common OR gate. This is, an output will be provided at terminal 72 when one or more or all of the NAND gates provide an output.

Resistor 44' of circuit 60 and the base emitter diode of transistor 48 of circuit 60 act as a common load impedance for all circuits. The type A circuit 60 operates in identical fashion with the circuit of FIG. 1. The type B circuit 62 operates as follows. When all inputs of the type B circuit are activated, transistor 42 thereof will be turned on, thereby drawing load current through resistor 44' and the base-emitter diode of transistor 48 of the type A circuit. Current will be supplied to the base of transistor 48 in the circuit of 62 via resistor 64 to saturate transistor 48 when the input pulse to transistor 28 reaches a level high enough to begin to saturate transistor 42. Thus the diode 50 and transistor 48 of circuit 62 will act in a similar manner to the circuit of FIG. 1. The only difference in a type B circuit is that the load current for transistor 42 does not flow through the base-emitter diode of transistor 48 due to the relatively high value of resistor 64, but instead flows through resistor 44' and the base-emitter diode of transistor 48 in circuit 60.

When none of the NAND gates of the FIG. 2 system are energized, the output potential at point 72 will be a positive voltage representative of a binary ONE. When one NAND gate (either type A or type B) is activated, the potential at point 72 will fall close to ground. When more than one NAND gate is activated, the potential at point 72 again will fall close to ground, although slightly closer than in the case when only one gate was activated. However this difference, although contributing some "noise" to the system, will still be within acceptable tolerance limits and thus cannot be sensed by further elements in the system to which point 72 is connected.

The components used in the system, with the exception of diodes and transistors, are identified in the drawing. The transistors used were all type 2N2784, and the diodes used all type GE PD31. However when the system is fabricated in microcircuit form, the diodes and transistors may be the equivalent of these diodes and transistors. As stated, the system of FIG. 1 and FIG. 2 are able to operate with propagation delay of approximately 10 nanoseconds, which was found to be on the order of one and one-half to two times better than prior art circuits wherein transistor 48 and its biasing resistor 46 were omitted.

Although the system of FIG. 1 is shown for illustrative purposes as comprising an emitter follower driver with a comon emitter output transistor, it will be understood that various other configurations may be used alternatively, for example as shown in the Blair patent supra. Thus the driver stage can be a common emitter circuit and the output stage can be an emitter follower, with the limiting transistor, such as 48, and a diode, such as 50, connected between the output of the emitter follower and the input of the common emitter stage. Alternatively, three stages can be used, two of them being emitter follower stages and the other being a common emitter stage. The limiting transistor 48 should be connected between the input to the system and a phase inverted output, with components so designed so that the diode 50 and transistor 48 will become conductive just as the output stage begins to saturate. As is well known, such design is well within the capabilities of those skilled in the art.

It will be understood that the pulse waveform shown are idealized in shape for purposes of facilitation of illustration. Further it will be understood that although discrete components may be recited in the appended claims, these claims are intended to cover such components when formed in a single silicon microcircuit monolith according to current integrated circuit practice.

While there has been described what is at present considered to be the preferred embodiment of the invention it will be apparent that various modifications and other embodiments thereof will occur to those skilled in the art within the scope of the invention. Accordingly, it is desired that the scope of the invention be limited by the appended claims only.

We claim:

1. In a high-speed inverter circuit of the type comprising:

(a) a source of bias potential, (b) a first transistor amplifying stage having input, output, and common terminals, said first stage including a first transistor and means for operatively connecting said first transistor to said source of bias potential, (c) a second transistor amplifying stage having input, output, and common terminals, said second stage including a second transistor having a base electrode and two further electrodes comprising an emitter and a collector, and a load resistor arranged to produce a voltage drop thereacross in response to the current which flows throgh said load resistor and the collector-emitter circuit of said second transistor from said source of bias potential when the collector-emitter circuit of said second transistor becomes conductive, one of said two further electrodes of said second transistor being connected to said output terminal of said second stage, one terminal of said load resistor being connected to one terminal of said source of bias potential, one of said first and second amplifying stages being an inverting stage and the other being non-inverting, (d) means for connecting said first and second amplifying stages in cascade so that the output of said first stage drives the input of said second stage, (e) means for applying between the input and common terminals of said first stage an input signal which is to be inverted, and (f) means for preventing said input signal from driving said second transistor into its saturation region of operation, said means including a diode, connected between the input of said first stage and the output of said second stage, which is reverse biased when the amplitude of said input signal is insufficient to drive said second transistor to saturation but which responds to said input signal, when the amplitude of said input signal becomes large enough to drive said second transistor to saturation, to conduct current of said input signal to said output terminal and thereby limit said input signal, the improvement comprising:

(g) a third transistor having a base electrode and two further electrodes comprising an emitter and a collector, one of said two further electrodes being connected to one electrode of said diode and the other of said two further electrodes being connected to said output terminal of said second stage so that said diode and the emitter-collector circuit of said third transistor are connected in series between said input terminal of said first stage and said output terminal of said second stage, said base electrode of said third transistor being connected to the other terminal of said load resistor.

2. The inverter of claim 1 including additional means for maintaining a continuous flow of current from said source, through said load resistor, and through the junction of said third transistor between its base electrode and said other of said two further electrodes thereof.

3. The inverter of claim 1 wherein said first transistor is connected in the emitter follower configuration, the emitter of said first transistor being directly connected to the base of said second transistor, said second transistor is connected in the common emitter configuration, the collector of said second transistor being directly connected to the emitter of said third transistor and said output terminal, and further including a resistor connected between the collector and emitter of said second transistor.

4. The inverter of claim 1 further including at least one additional inverter circuit as recited in claim 1, the resistance of the load resistor in said additional circuit being larger than that of the load resistor in said first inverter circuit, the collectors of the second transistors in both of said inverter circuits being connected together to form a common output terminal.

5. An inverter circuit, comprising:

(a) a source of a signal to be inverted, (b) a driver stage comprising a driver transistor having a collector connected to a first bias source terminal, a base connected to said signal source, and an emitter connected, via a first load resistor, to a second bias source terminal, the potential of which is different from that of said first bias source terminal, (c) an output stage comprising an output transistor connected in the common emitter configuration, the base of said output transistor being directly connected to the emitter of said driver transistor, the emitter of said output transistor being connected to a third bias source terminal, the collector of said output transistor being connected directly to an output terminal, said collector also being connected to a bias source terminal via a circuit comprising a second load resistor which provides a voltage drop thereacross in response to the flow of current from said bias source through the collector-emitter circuit of said output transistor when said output transistor becomes conductive, and (d) means comprising a control transistor and a diode for (1) providing a bypass from the base of said driver transistor to the collector of said output transistor only when the amplitude of said input signal is large enough to drive said output transistor to saturation, and (2) providing a non-linear impedance between the collector of said output transistor and the other terminal of said second load resistor, the emitter of said control transistor being connected directly to said output terminal, the base thereof being connected to said load resistor, and the collector thereof being connected to the base of said driver transistor via said diode, said diode and the collector-base diode of said control transistor being poled in opposite directions.

6. The circuit of claim 5 further including at least one additional inverter circuit as recited in claim 5, the resistance of the load resistor of said output transistor in said additional inverter circuit being larger than that of the load resistor in said first inverter circuit, the collectors of the second transistors in said first and said additional inverter circuits being connected together to form a common output terminal.

References Cited

UNITED STATES PATENTS

| | | | |
|---|---|---|---|
| 2,887,542 | 5/1959 | Blair | 330—24 |
| 2,999,169 | 9/1961 | Feiner | 330—29 |
| 3,075,151 | 1/1963 | Murray | 330—28 |
| 3,124,759 | 3/1964 | Dahlberg | 330—28 |
| 3,187,267 | 6/1965 | Merrington | 307—230 |
| 3,305,735 | 2/1967 | Moreines | 307—204 |
| 3,328,590 | 6/1967 | Kapsambelis | 330—29 |
| 3,365,587 | 1/1968 | Baur | 307—230 |
| 3,368,156 | 2/1968 | Kam | 330—29 |

ARTHUR GAUSS, Primary Examiner

H. A. DIXON, Assistant Examiner

U.S. Cl. X.R.

307—218; 330—20, 29